US008196088B2

(12) United States Patent
Oppold

(10) Patent No.: US 8,196,088 B2
(45) Date of Patent: Jun. 5, 2012

(54) METHOD AND STRUCTURE FOR SCREENING NFET-TO-PFET DEVICE PERFORMANCE OFFSETS WITHIN A CMOS PROCESS

(75) Inventor: Jeffrey H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 1158 days.

(21) Appl. No.: 11/949,066

(22) Filed: Dec. 3, 2007

(65) Prior Publication Data

US 2009/0144024 A1 Jun. 4, 2009

(51) Int. Cl.
*G06F 11/22* (2006.01)
*G06F 17/50* (2006.01)
(52) U.S. Cl. .................. 716/136; 716/106; 716/108
(58) Field of Classification Search .............. 716/106, 716/108, 136; 331/57
See application file for complete search history.

(56) References Cited

U.S. PATENT DOCUMENTS

| | | | |
|---|---|---|---|
| 6,933,731 B2 | 8/2005 | Reddy et al. | |
| 7,889,014 B1* | 2/2011 | Stoiber et al. | 331/74 |
| 2004/0261044 A1* | 12/2004 | Yonezawa | 716/4 |
| 2005/0134394 A1 | 6/2005 | Liu | |
| 2009/0058540 A1* | 3/2009 | Leatherman et al. | 331/57 |

OTHER PUBLICATIONS

"Tutorial—Cadence Design Environment", by Antonio J. Lopez Martin, Klipsch School of Electrical and Computer Engineering, New Mexico State University, http://www.ece.nmsu.edu/vlsi/cadence/CADENCE%20Manual.pdf, @ Oct. 2002.*

Office Action dated Nov. 9, 2010 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.
Response to Office Action dated Mar. 9, 2011 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.
First Office Action dated Nov. 9, 2010 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.
Tutorial—Cadence Design Environment, by Antonio J. Lopez Martin, Klipsch School of Electrical and Computer Engineering, New Mexico State University, http://www.ece.nmsu.eduivlsi/cadence/CADENCE%20Manual.pdf, Oct. 2002.

(Continued)

*Primary Examiner* — Jack Chiang
*Assistant Examiner* — Nha Nguyen
(74) *Attorney, Agent, or Firm* — Downs Rachlin Martin PLLC

(57) ABSTRACT

A method of screening on-chip variation in NFET-to-PFET device performance for as-manufactured integrated circuits (ICs) made using a CMOS process. The method includes defining an acceptable frequency- or period-based NFET-to-PFET device performance envelope by simulating a pair of ring oscillators, one of which contains only NFET transistors and the other of which contains only PFET transistors. The ring oscillators are then fabricated into each as-manufactured ICs. At screening time, the ring oscillators in each fabricated IC are tested to measure their frequencies (periods). These frequencies (periods) are then compared to the performance envelope to determine whether the NFET-to-PFET device performance of the corresponding IC is acceptable or not.

10 Claims, 7 Drawing Sheets

OTHER PUBLICATIONS

Advisory Action dated Jun. 14, 2011 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.

Response to Office Action dated Jun. 7, 2011 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.

Supplemental Response to Office Action dated Jun. 9, 2011 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.

Office Action dated Apr. 7, 2011 in connection with related U.S. Appl. No. 12/128,273, filed May 28, 2008, entitled "Design Structure for Method and Structure for Screening NFET-to-PFET Device Performance Offsets Within a CMOS Process," Inventor: Oppold, Jeffrey.

* cited by examiner

METHOD AND STRUCTURE FOR SCREENING NFET-TO-PFET DEVICE PERFORMANCE OFFSETS WITHIN A CMOS PROCESS

FIELD OF THE INVENTION

The present invention generally relates to the field of quality control for CMOS integrated circuits. In particular, the present invention is directed to a structure and method for screening NFET-to-PFET device performance offsets within a CMOS process.

BACKGROUND

In prior generations of complementary metallic oxide semiconductor (CMOS) technology, shipped product quality level (SPQL) exposure was generally controlled using statistical analyses of chip-to-chip, wafer-to-wafer and lot-to-lot variations resulting from variations in the steps of the process used to fabricate the integrated circuits (ICs). However, as feature size continues to shrink to 90 nm and below with advancing CMOS technologies, across-chip variations in features such as transistor channel length are increasingly affecting SPQL exposure.

One variation of interest in CMOS technology is the performance offset variation between p-type and n-type field effect transistors (PFETs and NFETs, respectively). A parameter often used in conventional PFET-to-NFET device performance analysis is the saturation current of the PFETs and NFETs. During Monte Carlo simulation of the saturation currents (Ion) of a PFET and a corresponding NFET, a scattergram (such as scattergram 100 of FIG. 1) is typically obtained, as are statistics, such as the normalized distribution 200 of FIG. 2. Designers can then use this and other statistical information in performing their circuit analyses.

For example and referring again to FIG. 1, statistics calculated for the PFET and NFET saturation currents can be used to define a set of test screening boundaries 104, here plus and minus three standard deviations (±3σ), that define an acceptable performance envelope 108 that sets the upper and lower bounds on acceptable PFET-to-NFET Ion performance offset. Designers would then use test screening limit boundaries 104 (i.e., the ±3σ values) during testing of as-manufactured ICs to screen-out ICs having PFET-to-NFET device performance mismatch that falls outside acceptable performance envelope 108. Fabricated ICs having actual PFET-to-NFET Ion performance at, for example, points 112 outside acceptable performance envelope 108 would not be shipped, whereas chips having actual PFET-to-NFET Ion performance at points such as points 116 within the acceptable performance envelope would be shipped (assuming other screening measures are satisfied).

SUMMARY OF THE DISCLOSURE

In one implementation, the present disclosure is directed to a method of measuring PFET-to-NFET device performance offset in a CMOS process. The method includes: determining first frequencies of a model of a first ring oscillator design in which all transistors therein are PFETs, the first frequencies corresponding respectively to differing sets of parameter values of the CMOS process; determining second frequencies of a model of a second ring oscillator design in which all transistors therein are NFETs, the second frequencies corresponding respectively to the differing sets of the parameter values of the CMOS process; and defining test screening limits as a function of the first and second frequencies.

In another implementation, the present disclosure is directed to a method of screening integrated circuits (ICs) incorporating CMOS technology. The method includes: providing a plurality of CMOS ICs each including: a first ring oscillator in which all transistors therein are PFETs; a second ring oscillator in which all transistors therein are NFETs; and test points in communication with the first and second ring oscillators for measuring a first frequency of the first ring oscillator and a second frequency of the second ring oscillator; for each of the plurality of CMOS ICs, measuring the first and second frequencies via the test points so as to obtain corresponding respective first and second measured frequencies; and determining whether or not to ship ones of the plurality of CMOS ICs as a function of the first and second measured frequencies.

In a further implementation, the present disclosure is directed to an integrated circuit. The integrated circuit comprises a CMOS layout that includes: a plurality of PFETs; a plurality of NFETs; a first ring oscillator in which all transistors therein are ones of the plurality of PFETs, the first ring oscillator having a first frequency; and a second ring oscillator in which all transistors therein are ones of the plurality of NFETs, the second ring oscillator having a second frequency; and a plurality of test points in communication with the first and second ring oscillators so as to permit measurement of the first and second frequencies.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

Figure 1:
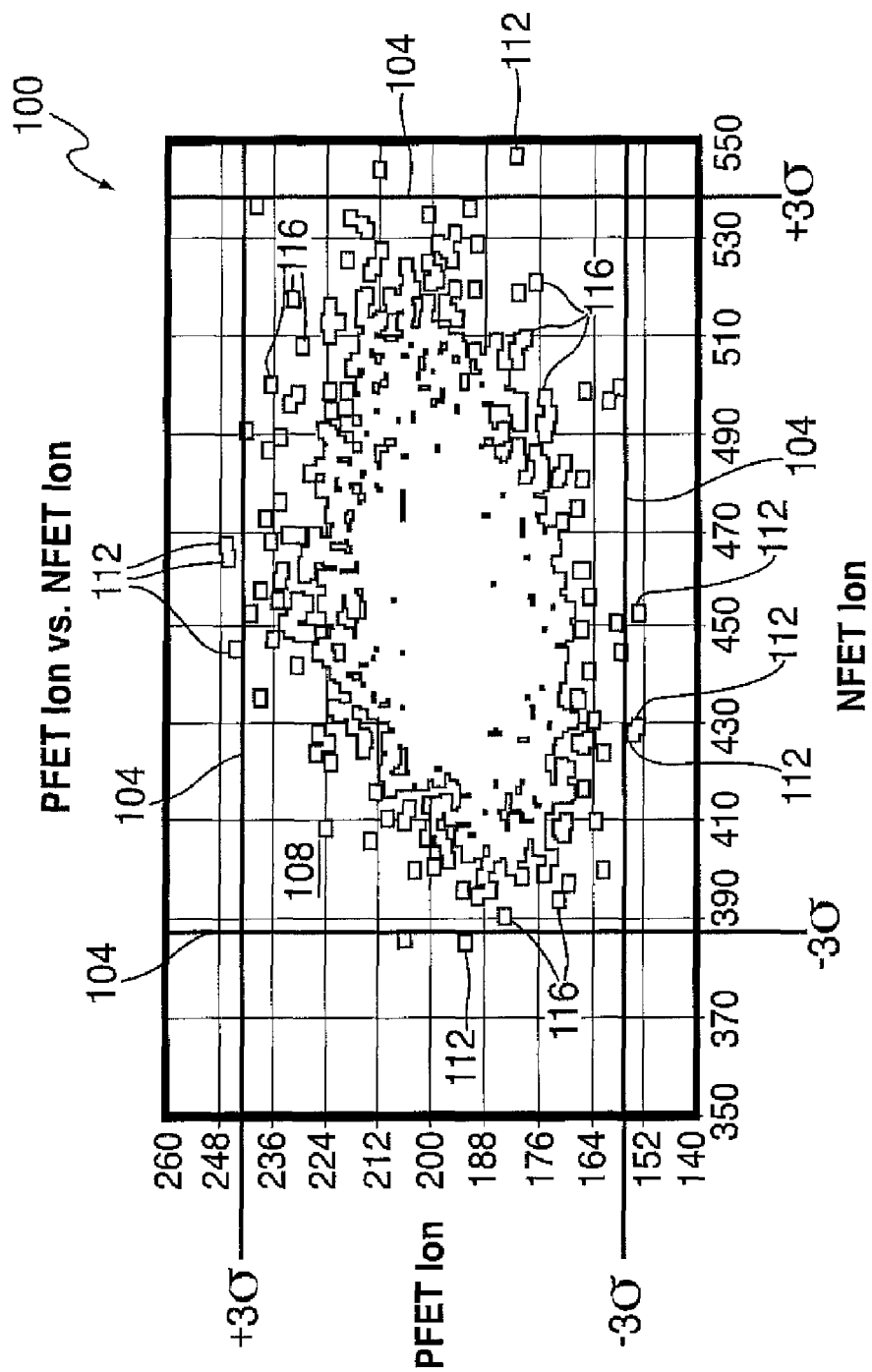
FIG. 1 is a prior art scattergram of PFET saturation current versus NFET saturation current showing variation in saturation current resulting from variation in a CMOS fabrication process and showing conventional test screening limit boundaries used in screening as fabricated circuit.
Figure 2:
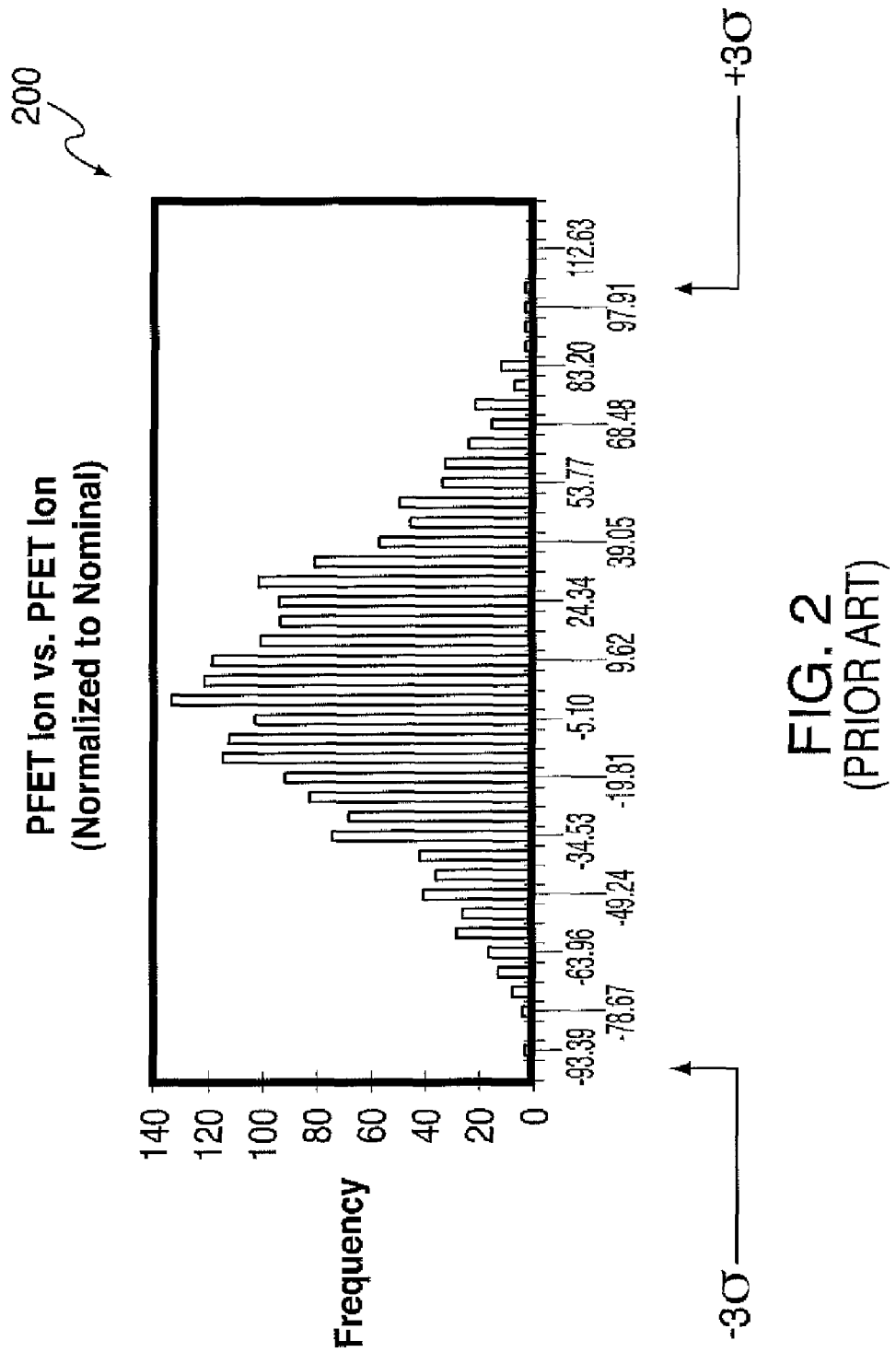
FIG. 2 is a prior art statistical distribution of NFET-to-PFET saturation current offset normalized to nominal.
Figure 3:
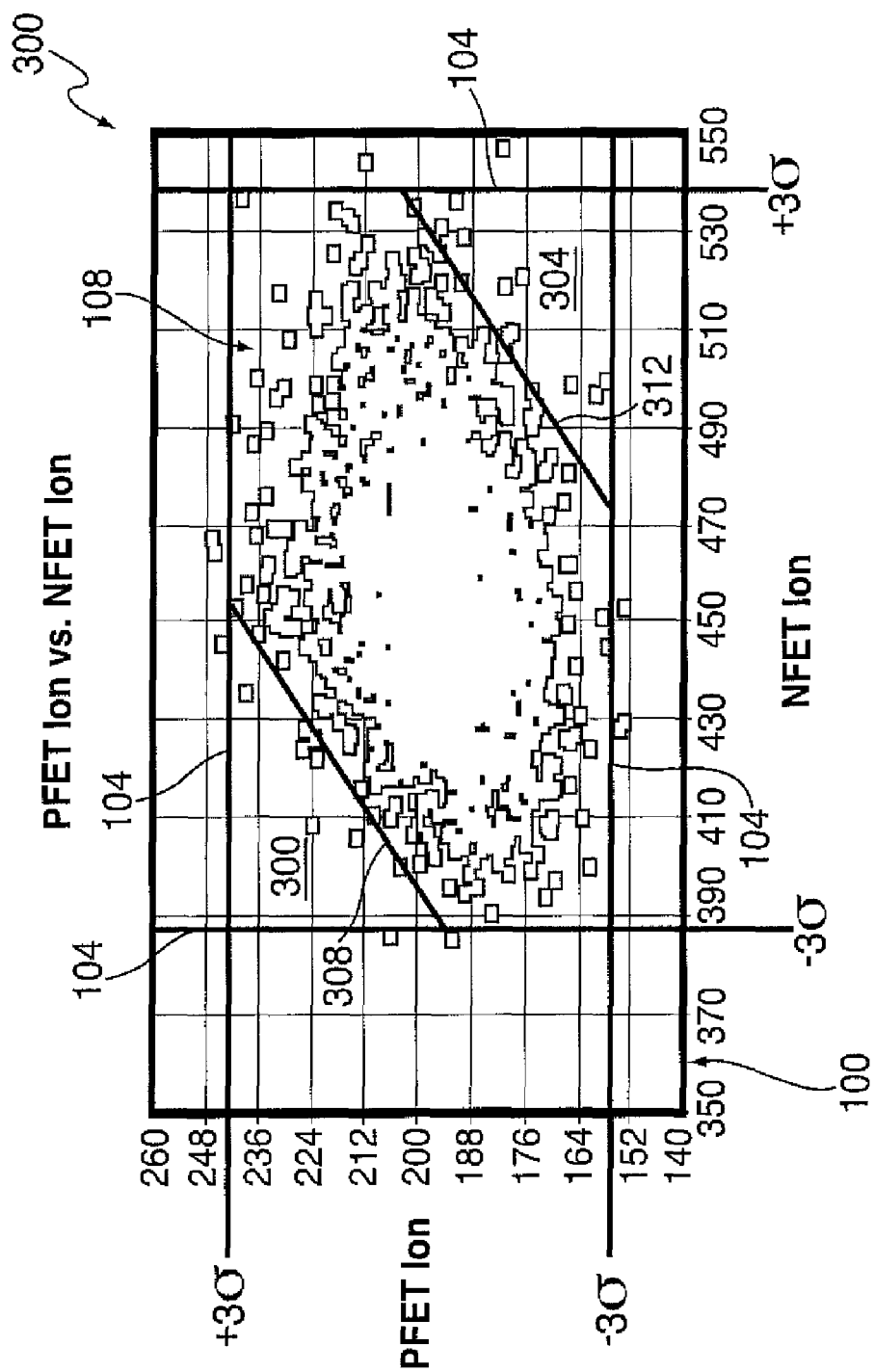
FIG. 3 is a scattergram of PFET saturation current versus NFET saturation current illustrating additional screening limit boundaries that would be desirable to reduce shipped product quality level (SPQL) exposure of CMOS-based integrated circuits.

FIG. 3 contains a diagram 300 illustrating the same scattergram 100 and test screening limit boundaries 104 shown in FIG. 1, as well as an additional set of boundaries 308 and 312 that take advantage of inherent NFET to PFET performance tracking envelope 108. This tracking is a result of many common process steps that NFETs and PFETs share (e.g. trench isolation, gate oxide growth, polysilicon deposition and etch, etc.) which in turn reduces the probability of NFET to PFET performance offsets within regions 300 and 304. Having a circuit characterization methodology that takes advantage of this tracking will result in faster circuits, which in turn results in higher performance systems at little or no extract cost. While test screening boundaries 104, here ±3σ values of each of PFET and NFET saturation currents (Ion), allow quality control to provide a certain shipped product quality level (SPQL), it has been recognized that potential SPQL exposure exists for PFET-to-NFET device performance mismatch having tested points falling within potential SPQL exposure regions 300, 304 that are within acceptable performance envelope 108. Therefore, it would be desirable to be able to establish additional test screening boundaries, such as boundaries 308, 312, that define the extent of potential SPQL exposure regions 300, 304. Unfortunately, it is difficult to measure saturation currents of as-fabricated NFETs and PFETs, making a screening process using boundaries 308, 312 impractical to implement.

The present inventor has found, however, that instead of using saturation current as the parameter of interest in a PFET-to-NFET performance offset screening process, such performance screening can be implemented using unique ring oscillators and focusing on the frequency (period) of each ring oscillator as the parameter of interest. As will be seen below, test screening limit boundaries similar to test screening limit boundaries 308, 312 based on frequency (period) can be established, and fabricated integrated circuits (ICs) containing instantiations of the ring oscillators can be readily tested to measure their frequencies (periods). Novel screening structures for implementing these novel methods can be described in detail below. It is noted that the pertinent steps of any method of the present disclosure are equally applicable to frequency and period, since each is simply the inverse of the other. Therefore, for example, despite the fact that the appended claims use only the terms "frequency" and "frequencies," it will be apparent to the reader that the terms "period" and "periods" can be substituted therefore, since any measurement of frequency will inherently yield a measurement of period.

Figure 4:
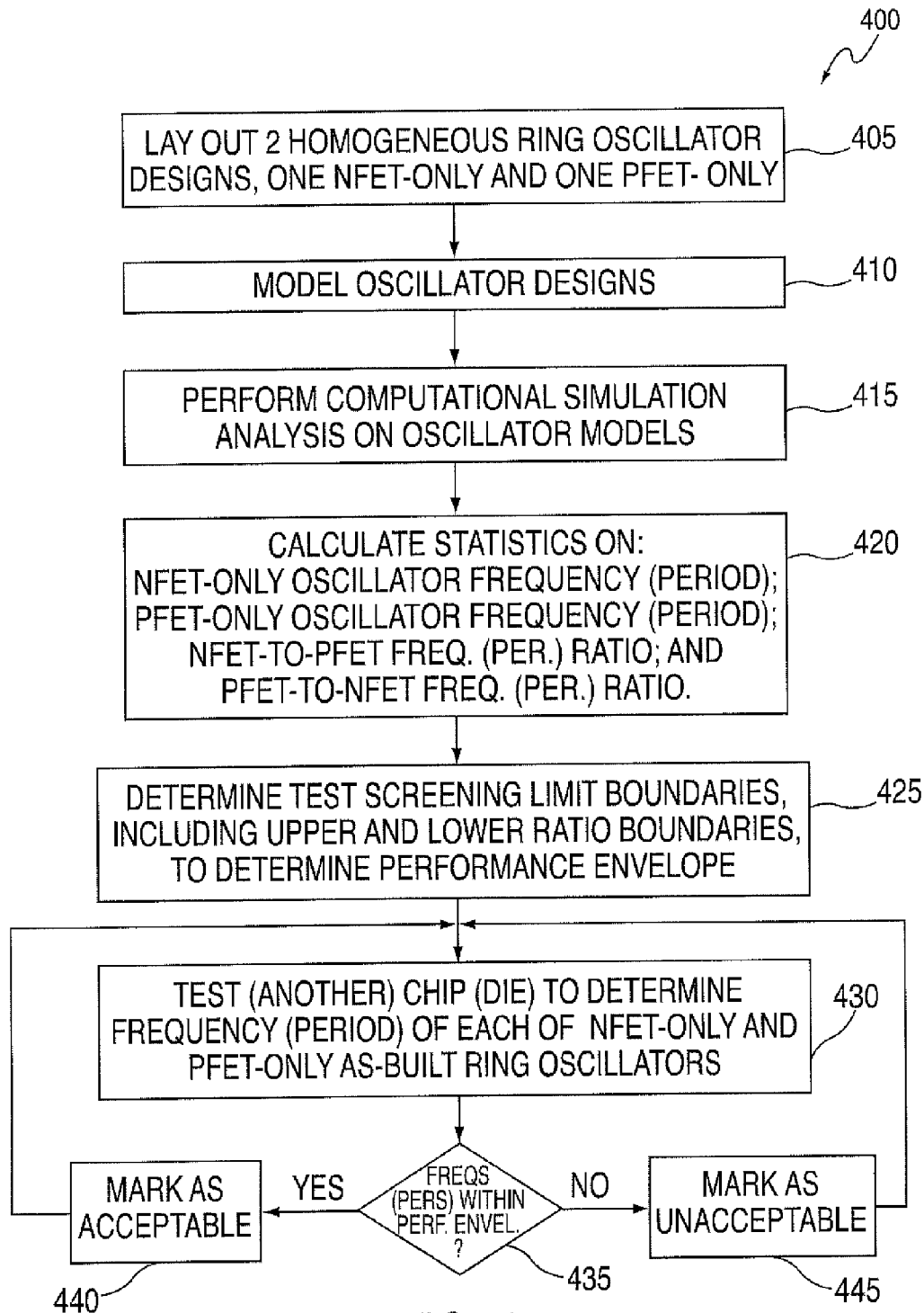
FIG. 4 is a flow diagram of a screening method in accordance with the present invention of reducing SPQL exposure CMOS-based integrated circuits.

FIG. 4 illustrates an exemplary screening method 400 of the present invention for use in screening as-manufactured CMOS-based ICs based on PFET-to-NFET device performance offset values. At step 405, a designer lays out two ring oscillator designs, a first ring oscillator design in which all of the transistors are only PFETs and a complementary second ring oscillator design in which all of the transistors are only NFETs. As will be described below, these ring oscillator designs will be used at two stages of screening method 400, first, at a modeling stage to develop test screening limit boundaries to be used in screening as-fabricated ICs and, second, at a fabrication stage in which the designs will be instantiated into fabricated ICs. During screening, the instantiated ring oscillators will be tested to measure their frequencies, which will be compared to the test screening limit boundaries to determine whether or not the corresponding respective ICs meet the NFET-to-PFET performance offset criteria.

Figure 5:
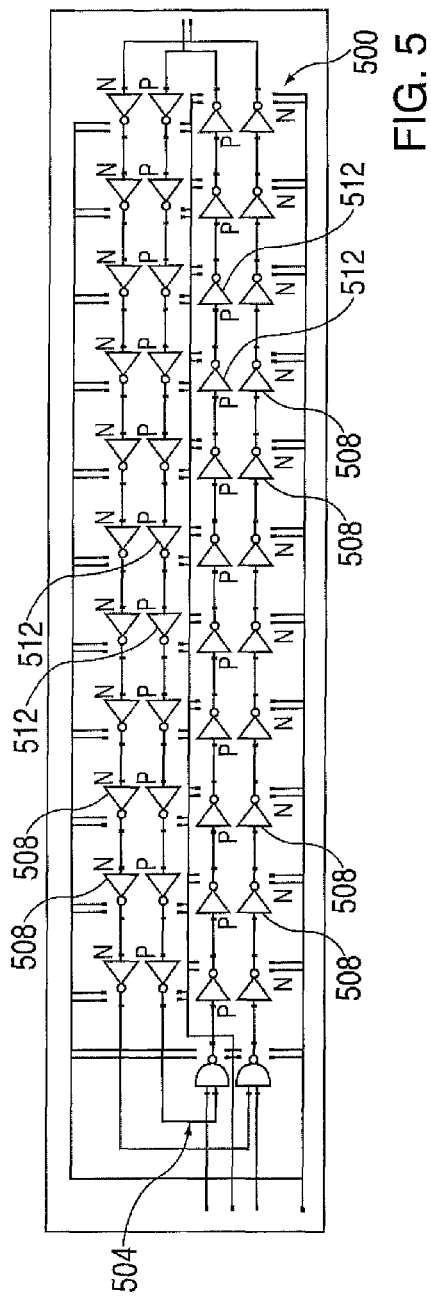
FIG. 5 is a schematic diagram of a pair of NFET and PFET ring oscillators that may be used in performing a method of the present invention.

FIG. 5 illustrates an NFET-only ring oscillator design 500 and a complementary PFET-only ring oscillator design 504 that may be used for the first and second ring oscillator designs for use in a screening method of the present invention, such as screening method 400. As readily seen in FIG. 5, each ring oscillator design 500, 504 is made up of a series of inverters 508, 512, much like conventional ring oscillators. However, a unique feature of ring oscillator designs 500, 504 is that all of the transistors (not shown, but see, e.g., FIG. 8A) of NFET-only oscillator design 500 are NFETs and all of the transistors (not shown, but see, e.g., FIG. 8B) of PFET-only oscillator design 504 are PFETs. By "complementary," it is meant that other aspects of NFET-only and PFET-only designs 500, 504, such as number of inverters 508, 512 and feature sizes, for example channel length and width, are designed to be the same. In other words, the only difference between NFET-only and PFET-only designs 500, 508 is that their dopings are complementary in charge type.

Figure 6:
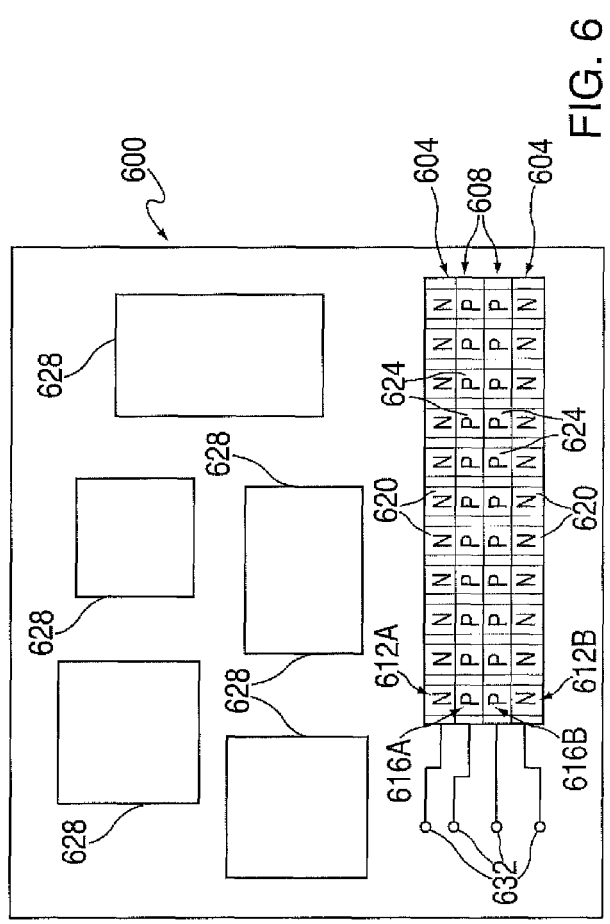
FIG. 6 is a high-level diagram of an exemplary physical layout of an integrated circuit containing the NFET and PFET ring oscillators of FIG. 5.

FIG. 6 illustrates an exemplary IC chip 600 that incorporates instantiations 604, 608 of NFET-only and PFET-only oscillator designs 500, 504 of FIG. 5. In this example, the layout of the NFETs and PFETs (not shown individually) is done in accordance with contemporary practice, i.e., with the NFETs and PFETs formed in corresponding respective NFET regions 612A-B and PFET regions 616A-B. As will be understood by those skilled in the art, each of NFET and PFET regions 612A-B, 616A-B are functionally partitioned into corresponding respective N-type inverter regions 620 and P-type inverter regions 624 by providing suitable wiring in the wiring layers (not shown) of IC chip 600. With this arrangement, PFET-only ring oscillator 608 is conveniently nested within NFET-only ring oscillator 604. An advantage to this configuration is that since it uses conventional CMOS cell library circuit layout techniques, all electrical effects, such as shallow trench isolation, N-well scattering, etc., are consistent across NFET-only and PFET-only ring oscillators 604, 608 and other circuitry 628 aboard IC chip 600. IC chip 600 also includes test points 632 that allow the frequencies of NFET-only and PFET-only ring oscillators 604, 608 to be tested after IC chip 600 has been fabricated. As mentioned above, it is these measured values that are used in screening method 400. The layout of NFET-only and PFET-only ring oscillators 604, 608 and test points 632 may be standardized into a standard cell library circuit so that it may be readily incorporated into differing CMOS-based chip designs.

Figures 7A, 7B:
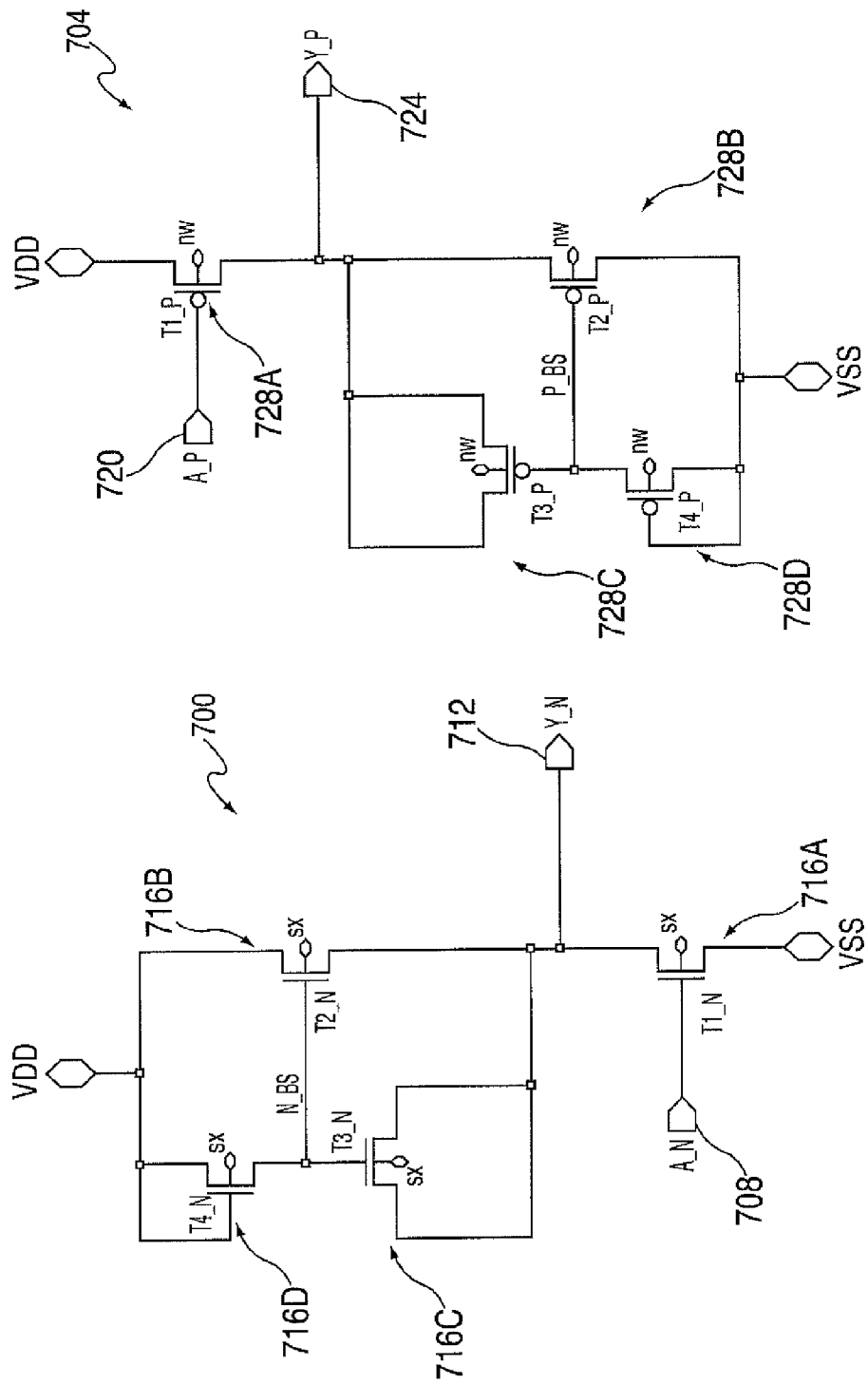
FIG. 7A is a schematic diagram of a bootstrap NFET inverter that may be used in the NFET ring oscillator of FIGS. 5 and 6.
FIG. 7B is a schematic diagram of a bootstrap PFET inverter that may be used in the PFET ring oscillator of FIGS. 5 and 6.

Before returning to the description of exemplary screening method 400 of FIG. 4, examples of simple homogeneous inverters 700, 704 suitable for use as, respectively, homogeneous inverters 504, 508 are provided in FIGS. 7A-B. FIG. 7A illustrates an NFET-only bootstrap inverter 700 that comprises an input 708, an output 712, and four NFETs 716A-D connected as shown in FIG. 7A. When input 708 is high, NFET 716A is on and holds output 712 low. NFET 716D charges up capacitor NFET 716C to VDD minus threshold. When input 708 goes low, NFET 716A turns off, allowing NFET 716B to pull up output 712, which pulls bootstrap capacitor NFET 716C above VDD, which overdrives the threshold of NFET 716B so that the output reaches VDD.

FIG. 7B illustrates a PFET-only bootstrap inverter 704 that is complementary to NFET-only bootstrap inverter 700 of FIG. 7B. In FIG. 7B, PFET-only bootstrap inverter 704 comprises an input 720, an output 724, and four PFETs 728A-D connected as shown. When input 720 is low, PFET 728A is on and holds output 724 high. NFET 728D charges up capacitor NFET 728C to ground plus threshold. When input 720 goes high, NFET 728A turns off, allowing NFET 728B to pull down output 724, which pulls bootstrap capacitor NFET 728C below ground, which overdrives the threshold of NFET 728B so that the output reaches the ground voltage. It is noted that while homogeneous bootstrap inverters 700, 704 have been shown, there may be other transistor-homogeneous inverters that may be used in accordance with the present invention.

Referring back to FIG. 4, once the NFET-only and PFET-only oscillator designs have been obtained, at step 410 the oscillator designs are simulated, or modeled, using suitable simulation software, such as SPICE (Simulation Program with Integrated Circuit Emphasis) or any SPICE-like variant. At step 415, the NFET-only and PFET-only ring oscillator models are subjected to computational simulation analysis, such as the Monte Carlo method, that uses differing values of process parameters to calculate values of a set of four parameters relating to the NFET-only and PFET-only ring oscillators that result from the varying process parameters. The process parameters used in this analysis are those parameters that are known to vary and cause chip-to-chip, wafer-to-wafer, and lot-to-lot variations that affect as-fabricated IC performance. The four parameters calculated during the simulation analysis are: 1) the NFET-only ring oscillator period, PER_N; 2) the PFET-only oscillator period PER_P; 3) the ratio of NFET-only ring oscillator period to PFET-only, RATIO_N2P; and 4) the ratio of PFET-only ring oscillator period to NFET-only, RATIO_P2N. At step 420, the mean and standard deviation of each of these four parameters are calculated. As an example, Table I illustrates statistics, here mean and ±3$a$, calculated for NFET-only and PFET-only ring oscillators designed for a 65 NM CMOS process.

TABLE I

| Parameter | -3 σ (ns) | Mean (ns) | +3 σ (ns) |
|---|---|---|---|
| PER_N | 326.6 | 591.9 | 946.4 |
| PER_P | 695.2 | 1216.8 | 1862.1 |
| RATIO_N2P | 0.2852 | 0.4915 | 0.7563 |
| RATIO_P2N | 1.3222 | 2.0346 | 3.5063 |

With these statistics calculated, screening method 400 can proceed to step 425 at which a set of test screening limit boundaries can be determined and set.

Figure 8:
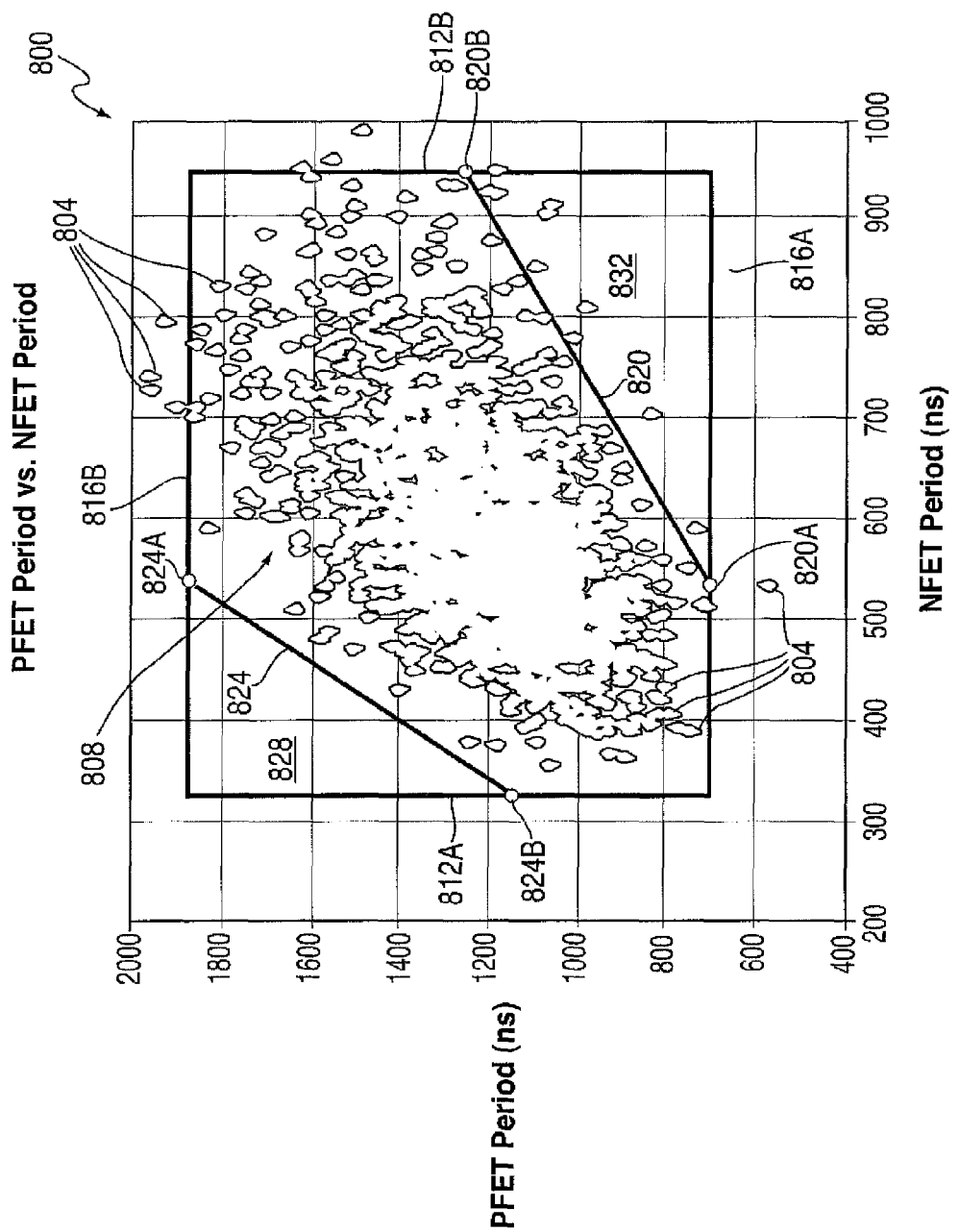
FIG. 8 is a scattergram of PFET period versus NFET period for a pair of complementary PFET and NFET ring oscillator designs showing enhanced test screening limit boundaries that include upper and lower ratio screen limit boundaries that can be determined using a screening method of the present invention.

The determining and setting of such test screening limit boundaries can be illustrated in the context of the example of Table I, above, and the scattergram 800 shown in FIG. 8. Scattergram 800 shows data points 804 of the PFET-only ring oscillator periods versus NFET-only ring oscillator periods for the simulated 65 NM CMOS NFET-only and PFET-only ring oscillators as determined from the simulation analysis. As will be understood by those skilled in the art, each data point 804 corresponds to a corresponding set of values for the variable process parameters at issue, as selected by the chosen simulation method, for example, the Monte Carlo method, during the simulation analysis. Assuming for the sake of this example that ±3$a$ of the periods PER_N. PER_P of the NFET-only and PFET-only ring oscillators are satisfactory gross boundaries for acceptable performance envelope 808, lower and upper boundaries 812A-B for the NFET period PER_N are set to the corresponding respective values of 326.6 ns and 946.4 ns, and lower and upper boundaries 816A-B for the PFET period PER_P are set to the corresponding respective values of 695.2 ns and 1862.4 ns.

In addition to the 3σ lower and upper boundaries 812A-B, 816A-B on the NFET and PFET periods PER_N. PER_P, the boundaries of acceptable performance envelope 808 also include lower and upper ratio test screening limit boundaries 820, 824 that are used during screening (see below) to screen-out as-fabricated ICs having measured NFET-to-PFET device performance mismatch points that fall in the potential SPQL exposure regions 828, 832 that generally correspond, respectively, to potential SPQL exposure regions 300, 304 of FIG. 3. Lower and upper ratio test screening boundaries 820, 824 are determined as follows.

At the nominal values, the ratio of NFET-only ring oscillator period to PFET-only ring oscillator period, RATIO_N2P, is simply equal to the ratio of the nominal value of the NFET-only ring oscillator period PER_N to the nominal value of the PFET-only ring oscillator period PER_P, and the ratio of NFET-only ring oscillator period to PFET-only, RATIO_P2N is simply the inverse of that ratio. But, at the ±3σ end points, the 3σ frequency offset of one oscillator to the absolute 3σ frequency limit of the other oscillator needs to be determined. For the NFET-to-PFET ratios, the following equation can be written:

$$PER\_N/(PER\_P \times Multiplier) = RATIO\_N2P \quad \{1\}$$

where PER_N is the value of the NFET period at a given statistic (e.g., -3σ), PER-P is the value of PFET period at the given statistic, RATIO-N2P is the value of the NFET-to-PFET ratio at the given statistic and Multiplier is a PFET multiplier value that satisfies Equation {1}. Rearranging Equation {1} allows for solution of Multiplier:

$$Multiplier = PER\_N/(PER\_P \times RATIO\_N2P) \quad \{2\}$$

Similarly for the PFET-to-NFET ratios, Equation {2} becomes:

$$Multiplier = PER\_P/(PER\_N \times RATIO\_P2N) \quad \{3\}$$

Appropriate Multipliers can then be used to calculate the endpoints 820A-B, 824A-B of lower and upper ratio test screening boundaries 820, 824, respectively, as they fall along the corresponding respective 3σ lower and upper boundaries 812A-B, 816A-B.

For the ±3σ example of Table I and FIG. 8, endpoints 820A-B of lower ratio test screening boundary 820 along -3σ lower boundary 816A of the PFET period and +3σ upper boundary 812B of the NFET period are calculated as follows. First, from Table I, above, the -3σ values of PER_P, PER_N and RATIO_P2N are, respectively, 695.2 ns, 326.6 ns and 1.3222. Inserting these values into Equation {3} shows that Multiplier=695.2/(326.6×1.3222)=1.610. Multiplying the -3σ value of PER_N, i.e., 326.6 ns, by 1.610 yields a calculated PER_N of 525.8 ns. Consequently, the coordinates of endpoint 820A on scattergram 800 is (525.8, 695.2).

Similarly, endpoint 620B along +3σ upper boundary 812B is calculated. First, from Table I, above, the +3σ values of PER_N, PER_P and RATIO_N2P are, respectively, 946.4 ns, 1862.1 ns and 0.7563. Inserting these values into Equation {2} shows that Multiplier=946.4/(1862.1×0.7563)=0.672. Multiplying the +3σ value of PER_P, i.e., 1862.1 ns, by 0.672 yields a calculated PER_N of 1214.1 ns. Consequently, the coordinates of endpoint 820B on scattergram 800 is (946.4, 1214.1).

Endpoints 824A-B of upper ratio test screening boundary 824 along +3σ upper boundary 816B of the PFET period and -3σ lower boundary 812A of the NFET period are similarly calculated as follows. First, from Table I, above, the +3σ values of PER_P, PER_N and RATIO_P2N are, respectively, 1862.1 ns, 946.4 ns and 3.5063. Inserting these values into Equation {3} shows that Multiplier=1862.1/(946.4× 3.5063)=0.5611. Multiplying the +3σ value of PER_N, i.e., 946.4 ns, by 0.5611 yields a calculated PER_N of 531.1 ns. Consequently, the coordinates of endpoint 824A on scattergram 800 is (531.1, 1862.1).

Similarly, endpoint 824B along −3σ lower boundary 812A is calculated. First, from Table I, above, the +3σ values of PER_N, PER_P and RATIO_N2P are, respectively, 326.6 ns, 695.2 ns and 0.2852. Inserting these values into Equation {2} shows that Multiplier=326.6/(695.2×0.2852)=1.648. Multiplying the −3σ value of PER_P, i.e., 695.2 ns, by 1.648 yields a calculated PER_N of 1145.5 ns. Consequently, the coordinates of endpoint 824B on scattergram 800 is (326.6, 1145.5).

With the endpoints 820A-B, 824A-B of lower and upper ratio test screening boundaries 820, 824 known, it is a simple matter to calculate the coordinates of any point along either of these boundaries, since they are simply straight lines. It is noted that while the foregoing example is based on ±3σ performance limits, the foregoing mathematics can be applied to any multiples of the standard deviation desired.

After an acceptable performance envelope, such as performance envelope 808, has been defined, it can be used to screen chips or dies manufactured to contain instantiations of the NFET-only and PFET-only ring oscillator designs, such as ring oscillator designs 500, 504 of FIG. 5, used to obtain the subject performance envelope. Consequently, at step 430 a chip or die is tested to determine the frequencies (periods) of the NFET-only and PFET-only oscillators onboard the chip or die. Then, at step 435 these measured frequencies are compared to the subject performance envelope. If the measured frequencies (periods) fall within the performance envelope, at step 440 the chip or die may be marked as passing the NFET-to-PFET device performance offset screening. However, if the measured frequencies (periods) fall outside the performance envelope, at step 445 the chip or die may be marked as failing the NFET-to-PFET device performance offset screening. Steps 430, 435, 440 and 445 may be repeated for as many chips or dies that remain to be tested.

Exemplary embodiments have been disclosed above and illustrated in the accompanying drawings. It will be understood by those skilled in the art that various changes, omissions and addition may be made to that which is specifically disclosed herein without departing from the spirit and scope of the present invention.

What is claimed is:

1. A method of measuring PFET-to-NFET device performance offset in a CMOS process, the method comprising:
   automatedly determining first frequencies of a model of a first complementary ring oscillator design in which all transistors therein are PFETs, the first frequencies corresponding respectively to differing sets of parameter values of the CMOS process;
   automatedly determining second frequencies of a model of a second complementary ring oscillator design in which all transistors therein are NFETs complementary to the PFETs of the first complementary ring oscillator, the second frequencies corresponding respectively to the differing sets of the parameter values of the CMOS process; and
   defining test screening limits as a function of the first and second frequencies;
   wherein said defining of the test screening limits includes:
      defining a lower PFET ring oscillator screening limit boundary;
      defining an upper PFET ring oscillator screening limit boundary;
      defining a lower NFET ring oscillator screening limit boundary;
      defining an upper NFET ring oscillator screening limit boundary;
      defining a first PFET-to-NFET ratio screening limit boundary extending between the lower PFET ring oscillator screening limit boundary and the upper NFET ring oscillator screening limit boundary; and
      defining a second PFET-to-NFET ratio screening limit boundary extending between the upper PFET ring oscillator screening limit boundary and the lower NFET ring oscillator screening limit boundary;
   wherein:
      the first frequencies have a first statistical distribution having a first standard deviation and said defining of the lower and upper PFET ring oscillator screening limit boundaries is performed as a function of the first standard deviation; and
      the second frequencies have a second statistical distribution having a second standard deviation and said defining of the lower and upper NFET ring oscillator screening limit boundaries is performed as a function of the second standard deviation.

2. A method according to claim 1, wherein said determining of the first and second frequencies comprises performing Monte Carlo simulation on the first and second ring oscillator designs.

3. A method according to claim 1, further comprising:
   providing a fabricated integrated circuit that includes a first instantiation of the first ring oscillator design and a second instantiation of the second ring oscillator design;
   testing the first instantiation to determine a first frequency;
   testing the second instantiation to determine a second frequency; and
   comparing the first and second frequencies to the test screening limits.

4. A method of screening integrated circuits (ICs) incorporating CMOS technology, the method comprising:
   providing a plurality of CMOS ICs each including:
      a first ring oscillator in which all transistors therein are PFETs;
      a second ring oscillator in which all transistors therein are NFETs; and
      test points in communication with the first and second ring oscillators for measuring a first frequency of the first ring oscillator and a second frequency of the second ring oscillator;
   for each of the plurality of CMOS ICs, measuring the first and second frequencies via the test points so as to obtain corresponding respective first and second measured frequencies; and
   determining whether or not to ship ones of the plurality of CMOS ICs as a function of the first and second measured frequencies;
   wherein said step of determining whether or not to ship ones of the plurality of CMOS ICs includes comparing the first and second measured frequencies with screening limit boundaries that include an upper ratio screening limit boundary and a lower ratio screening limit boundary;
   the method further comprising:
      determining the upper and lower ratio screening limit boundaries includes performing a statistical analysis on the first and second frequencies using a model containing the first and second ring oscillators; and
      based on the statistical analysis:
         defining a lower PFET ring oscillator screening limit boundary;

defining an upper PFET ring oscillator screening limit boundary;

defining a lower NFET ring oscillator screening limit boundary;

defining an upper NFET ring oscillator screening limit boundary;

defining a first PFET-to-NFET ratio screening limit boundary extending between the lower PFET ring oscillator screening limit boundary and the upper NFET ring oscillator screening limit boundary; and defining a second PFET-to-NFET ratio screening limit boundary extending between the upper PFET ring oscillator screening limit boundary and the lower NFET ring oscillator screening limit boundary;

wherein:

said defining of the first PFET-to-NFET ratio screening limit boundary includes:

calculating a first endpoint of the first PFET-to-NFET ratio screening limit boundary that falls along the lower PFET ring oscillator screening limit boundary; and calculating a second endpoint of the first PFET-to-NFET ratio screening limit boundary that falls along the upper NFET ring oscillator screening limit boundary; and said defining of the second PFET-to-NFET ratio screening limit boundary includes:

calculating a third endpoint of the second PFET-to-NFET ratio screening limit boundary that falls along the upper PFET ring oscillator screening limit boundary; and calculating a fourth endpoint of the second PFET-to-NFET ratio screening limit boundary that falls along the lower NFET ring oscillator screening limit boundary.

5. A method according to claim 4, wherein said performing of the statistical analysis includes performing Monte Carlo simulation on the model.

6. A method according to claim 4, wherein:

said defining of the first PFET-to-NFET ratio screening limit boundary further includes:

calculating a first multiplier=$PFET_{lower}/(NFET_{lower} \times LBS_{PFET/NFET\,Ratio})$;

calculating a second multiplier=$NFET_{upper}/(PFET_{upper} \times UBS_{NFET/PFET\,Ratio})$;

calculating a third multiplier=$PFET_{upper}/(NFET_{upper} \times UBS_{PFET/NFET\,Ratio})$; and calculating a fourth multiplier=$NFET_{lower}/(PFET_{lower} \times LBS_{NFET/PFET\,Ratio})$;

wherein:

$PFET_{lower}$ is the value of the lower PFET ring oscillator screening limit boundary;

$NFET_{lower}$ is the value of the lower NFET ring oscillator screening limit boundary;

$PFET_{upper}$ is the value of the upper PFET ring oscillator screening limit boundary;

$NFET_{upper}$ is the value of the upper NFET ring oscillator screening limit boundary;

$LBS_{NFET/PFET\,Ratio}$ is a lower bound statistic for the ratio of NFET-to-PFET frequencies;

$LBS_{PFET/NFET\,Ratio}$ is a lower bound statistic for the ratio of PFET-to-NFET frequencies;

$UBS_{NFET/PFET\,Ratio}$ is an upper bound statistic for the ratio of NFET-to-PFET frequencies; and $UBS_{PFET/NFET\,Ratio}$ is an upper bound statistic for the ratio of PFET-to-NFET frequencies.

7. A method according to claim 6, wherein:

said calculating of the first endpoint includes multiplying together the first multiplier and the lower NFET ring oscillator screening limit boundary;

said calculating of the second endpoint includes multiplying together the second multiplier and the lower PFET ring oscillator screening limit boundary;

said calculating of the third endpoint includes multiplying together the first multiplier and the upper NFET ring oscillator screening limit boundary; and said calculating of the fourth endpoint includes multiplying together the first multiplier and the upper PFET ring oscillator screening limit boundary.

8. A method of measuring PFET-to-NFET device performance offset in a CMOS process, the method comprising:

automatedly determining first frequencies of a model of a first complementary ring oscillator design in which all transistors therein are PFETs, the first frequencies corresponding respectively to differing sets of parameter values of the CMOS process;

automatedly determining second frequencies of a model of a second complementary ring oscillator design in which all transistors therein are NFETs complementary to the PFETs of the first complementary ring oscillator, the second frequencies corresponding respectively to the differing sets of the parameter values of the CMOS process; and defining test screening limits as a function of the first and second frequencies;

wherein said defining of the test screening limits includes:

defining a lower PFET ring oscillator screening limit boundary;

defining an upper PFET ring oscillator screening limit boundary;

defining a lower NFET ring oscillator screening limit boundary;

defining an upper NFET ring oscillator screening limit boundary;

defining a first PFET-to-NFET ratio screening limit boundary extending between the lower PFET ring oscillator screening limit boundary and the upper NFET ring oscillator screening limit boundary; and defining a second PFET-to-NFET ratio screening limit boundary extending between the upper PFET ring oscillator screening limit boundary and the lower NFET ring oscillator screening limit boundary;

wherein:

said defining of the first PFET-to-NFET ratio screening limit boundary includes:

calculating a first endpoint of the first PFET-to-NFET ratio screening limit boundary that falls along the lower PFET ring oscillator screening limit boundary; and calculating a second endpoint of the first PFET-to-NFET ratio screening limit boundary that falls along the upper NFET ring oscillator screening limit boundary; and said defining of the second PFET-to-NFET ratio screening limit boundary includes:

calculating a third endpoint of the second PFET-to-NFET ratio screening limit boundary that falls along the upper PFET ring oscillator screening limit boundary; and calculating a fourth endpoint of the second PFET-to-NFET ratio screening limit boundary that falls along the lower NFET ring oscillator screening limit boundary.

9. A method according to claim 8, wherein:

said defining of the first PFET-to-NFET ratio screening limit boundary further includes:

calculating a first multiplier = $\text{PFET}_{lower}/(\text{NFET}_{lower} \times \text{LBS}_{PFET/NFET\,Ratio})$;

calculating a second multiplier = $\text{NFET}_{upper}/(\text{PFET}_{upper} \times \text{UBS}_{NFET/PFET\,Ratio})$;

calculating a third multiplier = $\text{PFET}_{upper}/(\text{NFET}_{upper} \times \text{UBS}_{PFET/NFET\,Ratio})$; and calculating a fourth multiplier = $\text{NFET}_{lower}/(\text{PFET}_{lower} \times \text{LBS}_{NFET/FET\,Ratio})$;

wherein:

$\text{PFET}_{lower}$ is the value of the lower PFET ring oscillator screening limit boundary;

$\text{NFET}_{lower}$ is the value of the lower NFET ring oscillator screening limit boundary;

$\text{PFET}_{upper}$ is the value of the upper PFET ring oscillator screening limit boundary;

$\text{NFET}_{upper}$ is the value of the upper NFET ring oscillator screening limit boundary;

$\text{LBS}_{NFET/PFET\,Ratio}$ is a lower bound statistic for the ratio of NFET-to-PFET frequencies;

$\text{LBS}_{PFET/NFET\,Ratio}$ is a lower bound statistic for the ratio of PFET-to-NFET frequencies;

$\text{UBS}_{NFET/PFET\,Ratio}$ is an upper bound statistic for the ratio of NFET-to-PFET frequencies; and $\text{UBS}_{NFET/NFET\,Ratio}$ is an upper bound statistic for the ratio of PFET-to-NFET frequencies.

10. A method according to claim 9, wherein:

said calculating of the first endpoint includes multiplying together the first multiplier and the lower NFET ring oscillator screening limit boundary;

said calculating of the second endpoint includes multiplying together the second multiplier and the lower PFET ring oscillator screening limit boundary;

said calculating of the third endpoint includes multiplying together the first multiplier and the upper NFET ring oscillator screening limit boundary; and said calculating of the fourth endpoint includes multiplying together the first multiplier and the upper PFET ring oscillator screening limit boundary.

* * * * *